United States Patent
Ferrari et al.

(10) Patent No.: US 10,511,317 B2
(45) Date of Patent: Dec. 17, 2019

(54) ELECTRIC QUANTITY MEASURING DEVICE COMPRISING AN ANALOG-DIGITAL CONVERTER

(71) Applicant: POLITECNICO DI MILANO, Milan (IT)

(72) Inventors: Giorgio Ferrari, Somma Lombardo (IT); Marco Carminati, Milan (IT); Giacomo Gervasoni, Galbiate (IT); Filippo Campoli, Cerea (IT)

(73) Assignee: Politecnico di Milano, Milan (IT)

( * ) Notice: Subject to any disclaimer, the term of this patent is extended or adjusted under 35 U.S.C. 154(b) by 0 days.

(21) Appl. No.: 16/080,694

(22) PCT Filed: Feb. 16, 2017

(86) PCT No.: PCT/IB2017/050877
§ 371 (c)(1),
(2) Date: Aug. 29, 2018

(87) PCT Pub. No.: WO2017/149402
PCT Pub. Date: Sep. 8, 2017

(65) Prior Publication Data
US 2019/0094813 A1 Mar. 28, 2019

(30) Foreign Application Priority Data
Mar. 4, 2016 (IT) .................. 102016000023111

(51) Int. Cl.
*H03M 1/06* (2006.01)
*G01R 19/00* (2006.01)
(Continued)

(52) U.S. Cl.
CPC ...... *H03M 1/0619* (2013.01); *G01R 19/0053* (2013.01); *G01R 19/18* (2013.01); *G01R 19/2506* (2013.01); *H03M 1/60* (2013.01)

(58) Field of Classification Search
None
See application file for complete search history.

(56) References Cited

U.S. PATENT DOCUMENTS

| | | | |
|---|---|---|---|
| 5,396,247 A | 3/1995 | Watanabe | |
| 6,255,976 B1* | 7/2001 | Watanabe | G04F 10/005 341/118 |
| 2017/0117914 A1* | 4/2017 | Choi | H03M 1/1028 |

OTHER PUBLICATIONS

International Search Report and Written Opinion in PCT/IB2017/050877 dated May 11, 2017.

* cited by examiner

*Primary Examiner* — Howard Williams
(74) *Attorney, Agent, or Firm* — Manelli Selter PLLC; Edward J. Stemberger

(57) ABSTRACT

It is described an electronic device (1) for measuring an electric quantity, comprising: an analog-digital conversion module (2) configured to digitally convert time portions of an analog signal ($S_M(t)$) to be measured alternated with time portions of a reference analog signal ($S_R(t)$), for supplying respective first ($D_{SM}$) and second pluralities ($D_{SR}$) of digital values and a digital processing module (3) configured to: calculate a first mean amplitude (A1) of the first pluralities of digital values, and a second mean amplitude (A2) of the second pluralities of digital values; the first and second mean amplitudes being proportional to a mean gain value of the analog-digital conversion module (2); supply a ratio value ($V_{RT}$) of the first mean amplitude to the second mean amplitude, representative of a measured amplitude of the analog signal ($S_M(t)$) to be measured.

12 Claims, 6 Drawing Sheets

(51) Int. Cl.
*G01R 19/18* (2006.01)
*G01R 19/25* (2006.01)
*H03M 1/60* (2006.01)

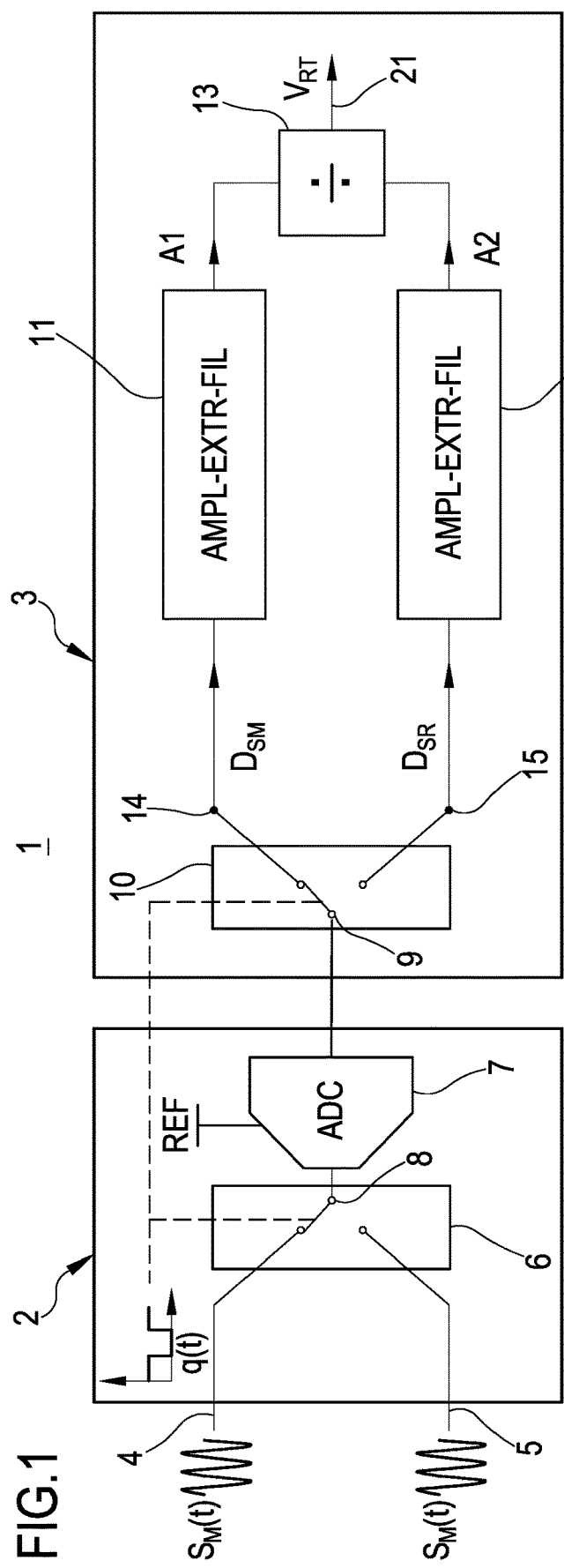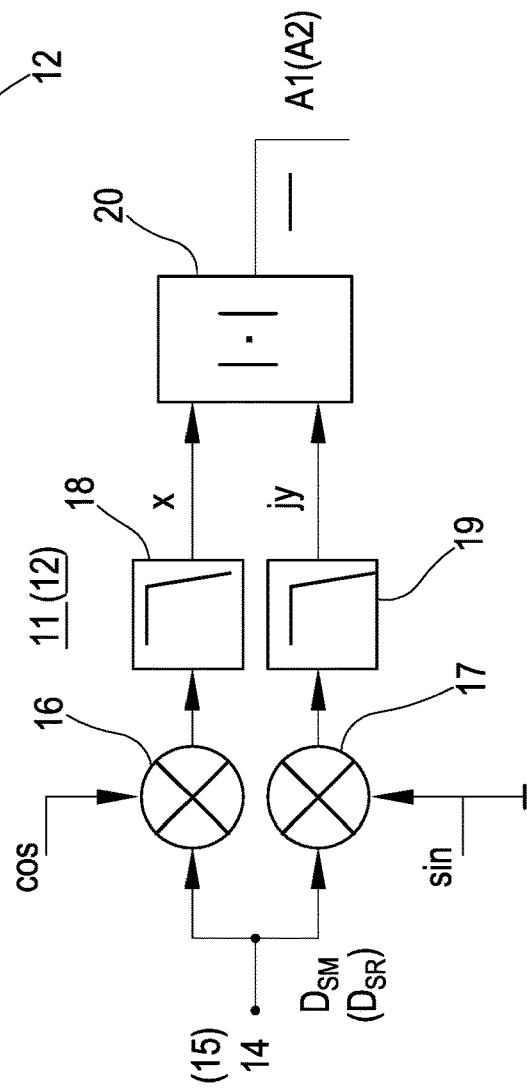

ELECTRIC QUANTITY MEASURING DEVICE COMPRISING AN ANALOG-DIGITAL CONVERTER

FIELD OF THE INVENTION

The present invention refers to the field for the acquisition of electrical signals. Particularly, the present invention refers to techniques for measuring electric quantities which use an analog-digital conversion.

PRIOR ART

According to a conventional arrangement for the analog-digital acquisition, a signal is suitably amplified and conditioned for being correctly converted in the digital field wherein is processed for extracting the amplitude.

When a known stimulus is applied to a system under study, such as for example a sensor, an electronic device or circuit, whose answer amplitude is useable for characterizing the system itself. In case of a sensor, the amplitude of the answer is associable to the physical magnitude measured by the sensor itself.

When it is necessary to measure the amplitude of the answer of the system with a very high resolution (for example for determining variations in the order of few parts for millions), it is typically required to perform a mean (or generally a filtering) operation on the signal for reducing the effect of the electronic noise superimposed on the signal of interest.

An intrinsic limitation to the duration of the mean (the reduction of the filtering band) is given by the slow fluctuations of the gain of the used analog-digital converter and possibly of the amplitude of the stimulus signal.

These fluctuations, for example, introduced by the reference voltage used by the analog-digital converter (or possibly by the digital-analog converter (DAC) used for generating the stimulus signal), cause a random variation of the amplitude of the processed signal with a power spectrum typically of the 1/f (flicker noise) type. Due to this power spectrum, the fluctuations cannot be reduced so that the duration of the mean is increased, and therefore dictate the ultimate limit of the system resolution.

It is noted that a common technique for reducing the effect of the 1/f type noises consists of modulating the signal for positioning it in a frequency wherein the noises added by the acquisition system are "white" and therefore are minimized by the mean process. This method, adopted by the lock-in amplifiers for example, is effective at reducing the effect of the electronic noises which are added to the signal of interest.

On the contrary, the Applicant has noted that the gain fluctuations (of the stimulus signal, conditioning electronics, ADC) change the signal amplitude independently from whether this signal is modulated or not, and therefore their effect is not reduced by using lock-in techniques or similar.

The document "A balance-detector for alternating-current bridges" C. R. Cosens, Proc. Phys. Soc. (1934), describes a circuit having a lock-in amplifier type arrangement.

The document "Compact FPGA-Based Elaboration Platform for Wide-Bandwidth Electrochemical Measurements" M. Carminati et al, IEEE I2MTC (2012) describes an architecture of a digital lock-in amplifier.

The article "A 12-Channel Dual-Lock-In Platform for Magnetoresistive DNA Detection with ppm Resolution" G. Gervasoni et al, IEEE BIOCAS (2014) outlines the resolution limits of two among the most common commercially available lock-in amplifiers.

Document "Low Level Optical Detection using Lock-in Amplifier Techniques" (APPLICATION NOTE AN1003 PerkinElmer) describes a division operation for eliminating the light power fluctuations of an optical source, measured by a lock-in amplifier.

SUMMARY OF THE INVENTION

The Applicant has observed that the techniques for acquiring signals by an analog-digital conversion according to the prior art do not have satisfying performances.

Moreover, the Applicant has understood that by performing a compensation of the fluctuations of the gain associated to the analog-digital conversion, improved performances can be obtained with respect to the ones obtainable by the prior art techniques.

The object of the present invention is obtained by a measure electronic device as defined in the independent claims and by particular embodiments thereof as defined in the dependent claims. According to another aspect, the present invention refers to a measure electronic system.

BRIEF DESCRIPTION OF THE DRAWINGS

The present invention is particularly described in the following in an exemplifying and non-limiting way, with reference to the attached drawings, in which:

FIG. 1 schematically shows a first exemplifying embodiment of an electronic device for measuring an electric quantity;

FIG. 2 schematically shows an example of an embodiment of a module for extracting the amplitude of a filtered signal, useable in the electronic device in FIG. 1;

DETAILED DESCRIPTION

Figure 3:
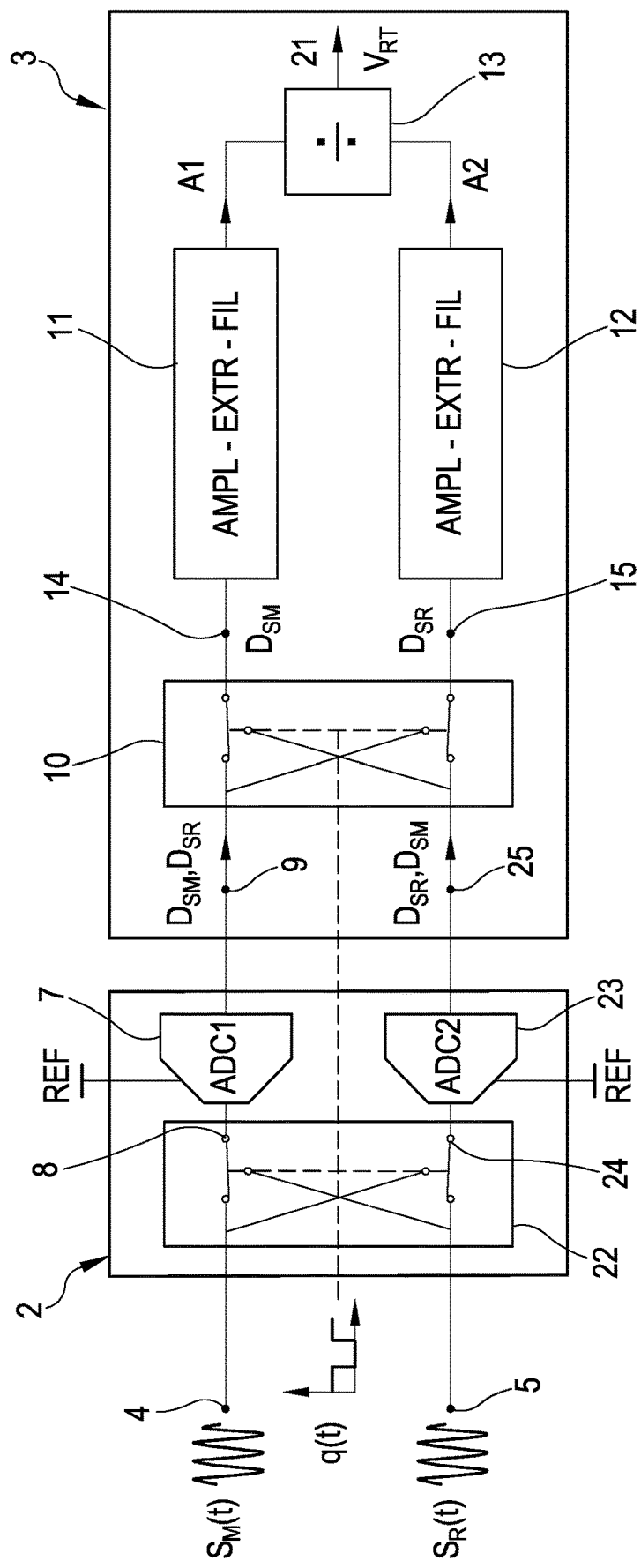
FIG. 3 schematically shows a second exemplifying embodiment of an electronic device for measuring an electric quantity.

In the present description, modules or circuit components identical or similar to each other are indicated in the figures by the same numeral references. FIG. 1 schematically shows a first embodiment of an electronic device 1 for measuring an electric quantity comprising an analog-digital conversion module 2 and a digital processing module 3.

The analog-digital conversion module 2 is provided with a first inlet terminal 4 for an analog signal $S_M(t)$ to be measured (in other words the signal of interest) and with a second inlet terminal 5 for a reference analog signal $S_R(t)$. Particularly, the electronic device enables to measure one or more values of the mean amplitude of the analog signal $S_M(t)$ estimated in predetermined time intervals.

Moreover, the analog-digital conversion module 2 is configured for digitally converting time portions of the analog signal $S_M(t)$ to be measured, alternated with time portions of the reference analog signal $S_R(t)$, by supplying respective first pluralities of digital values $D_{SM}(t)$ and second pluralities of digital values $D_{SR}(t)$.

The analog signal $S_M(t)$ to be measured and the reference analog signal $S_R(t)$ can exemplifyingly be, but in a non-limiting way, sinusoidal signals having the same frequency.

According to the first example in FIG. 1, the analog-digital conversion module 2 comprises a first inlet switching module 6 (or deviator) and an analog-digital converter (ADC) 7, provided with a first conversion terminal 8. Particularly, the analog-digital conversion module 2 in FIG. 1 comprises a single analog-digital converter.

The first inlet switching module 6 is configured to selectively connect/disconnect the first and second inlet terminals 4 and 5 from/to the first conversion terminal 8. Particularly, the first inlet switching module 6 is driven by a pilot periodical signal q(t) (a square wave, for example) having a period $T_q$ and an associated angular frequency $\omega_q$.

The first inlet switching module 6 is capable of supplying to the first conversion terminal 8, during a time window equal to half the period, $T_q/2$, a corresponding time portion of the analog signal to be measured $S_M(t)$, and during a following time window equal to the period $T_q/2$, a respective time portion of the reference analog signal $S_R(t)$.

The first analog-digital converter 7 is configured to digitally convert each time portion of the analog signal $S_M(t)$ to be measured and each time portion of the reference analog signal $S_R(t)$ and to supply respective digital samples to a first output terminal 9, according to the chronologic sequence by which the time portions are received by the first conversion terminal 8.

It is observed that the first analog-digital converter 7 can introduce a noise in the digital values of the signals $S_M(t)$ and $S_R(t)$. Particularly, a portion of the introduced noise can derive from fluctuations of the gain of the first analog-digital converter 7, caused by elements inside the converter itself or external active or passive elements determining the gain. For example, a fluctuation of the gain having a type "1/f" trend can be caused by a noise present in the voltage reference REF of the first analog-digital converter 7.

The first switching module 6 is implementable, for example, by analog switches (as model ADG752 manufactured by Analog Devices, for example). The first analog-digital converter 7 is, for example, a high performance converter (as ADS5542 from Texas Instruments). The periodical pilot signal q(t) can be generated by an external generator (not shown) of by a control module (a microcontroller or FPGA not shown) or by the digital processing module 3 itself.

The digital processing module 3, connected to the first output terminal 9, is configured for calculating a first mean amplitude A1, from the first pluralities of digital values $D_{SM}$, and a second mean amplitude A2, from the second pluralities of digital values $D_{SR}$.

The first and second mean amplitudes A1 and A2 are respectively the mean amplitudes of the signals $S_M(t)$ and $S_R(t)$ as digitized and are proportional to a mean gain value of the analog-digital conversion module 2.

Moreover, the digital processing module 3 is configured to supply a value of the ratio $V_{RT}$ between the first mean amplitude A1 and second mean amplitude A2, representing, as it will be better described in the following, an amplitude measured of the analog signal $S_M(t)$, More particularly, and according to FIG. 1, the digital processing module 3 comprises a first output switching module (or diverter) 10, a first extraction and filtering module 11 (AMPL-EXTR-FIL), a second extraction and filtering module 12 (AMPL-EXTR-FIL), and a calculating module 13.

The first output switching module 10 is configured to selectively connect/disconnect the first output terminal 9 to/from a first processing terminal 14, and to/from a second processing terminal 15, in order to supply the first pluralities of digital values $D_{SM}$ at the first processing terminal 14, and the second pluralities of digital values $D_{SR}$ at the second processing terminal 15. The first output switching module 10 is synchronized with the first output switching module 6 and is driven by the pilot signal q(t) itself.

The first output switching module 10 enables to reconstruct at the first processing terminal 14, in the digital field, the signal $S_M(t)$ to be measured, except for those time portions of the signal itself not digitally converted by the first analog-digital converter 7, because is digitally converting the reference signal $S_R(t)$. In the same way, the first output switching module 10 enables to reconstruct, at least partially, at the second processing terminal 15, in the digital field, the reference signal $S_R(t)$.

The first extraction and filtering module 11 is configured to extract from the first pluralities of digital values $D_{SM}$, associated to the different digital conversion time windows, at least one first mean amplitude A1. Each value of the first mean amplitude A1 is an average of the amplitude of the signal to be measured $S_M(t)$ performed on a predetermined number of samples.

FIG. 2 shows an example of an embodiment of the first extraction and filtering module 11 comprising a first multiplier 16, a second multiplier 17, a first filter 18, a second filter 19, and an amplitude calculating module 20.

In this case, the first multiplier 16 multiplies the first digital values $D_{SM}$ by a first sinusoidal digital signal locally generated, $\cos(\omega_0 t)$, and the first filter 18 filters the result of such multiplication. The first sinusoidal digital signal cos $(\omega_0 t)$ has the same frequency $\omega_0$ as the analog signal $S_M(t)$ to be measured.

The first filter 18 performs a mean of the digital values obtained by the multiplication, on a predetermined number of samples, reducing particularly the components at frequency $\omega_0$ and at multiples thereof obtained by the multiplication and the noise at high frequency. The first filter 18, such as for example a low-pass digital filter, gives back a mean value of the in-phase component x associated to the signal $S_M(t)$ to be measured.

At the same time, the second multiplier 17 multiplies the first digital values $D_{SM}$ by a second digital signal $\sin(\omega_0 t)$ (shifted 90° from the first digital signal $\cos(\omega_0 t)$) and the second filter 19 (similar or identical to the first filter 18) gives back a mean value of the quadrature component jy associated to the signal $S_M(t)$ to be measured.

The amplitude calculating module 20 calculates, from the mean value of the in-phase component x and from the mean value of the quadrature component jy, by simple calculating $\sqrt{x^2+y^2}$, the mean value of the first amplitude A1, which is directly proportional to the amplitude of the analog signal to be measured $S_M(t)$.

Referring again to FIG. 1, the second extraction and filtering module 12 is configured to extract, from the second pluralities of digital values $D_{SM}$, regarding the different digital conversion time windows, the second mean amplitude A12. The second extraction and filtering module 12 is similar or identical to the first extraction and filtering module 11, except that operates on the digital values $D_{SR}$ of the reference signal $S_R(t)$.

Referring again to FIG. 1, the calculating module 13 is configured to calculate the ratio value $V_{RT}$, as the ratio between the first mean amplitude A1 and the second mean amplitude A2, and to supply it to the output 21.

Referring to the operation of the electronic device 1, the analog signal $S_M(t)$ to be measured and the reference analog signal $S_R(t)$ (for example two sinusoids having the same frequency $\omega_0$) are supplied to the first input terminal 4 and to the second input terminal 5, respectively.

The first inlet switching module 6, driven by the pilot signal q(t), alternately transmits, to the first analog-digital converter 7, time portions of the analog signal $S_M(t)$ to be measured and time portions of the reference analog signal $S_R(t)$. The first analog-digital converter 7 therefore generates, at the first output terminal 9, the first pluralities of digital values $D_{SM}$ and the second pluralities of digital values $D_{SR}$, in an alternate way. As hereinbefore discussed, the first analog-digital converter 7 can introduce, into the digital conversion of the signals $S_M(t)$ and $S_R(t)$, fluctuations which can be represented as gain fluctuations $G_{ADC}(t)$.

The first output switching module 10, based on the pilot signal q(t), supplies to the first extraction and filtering module 11, the digital values $D_{SM}$ regarding the analog signal $S_M(t)$ to be measured, and to the second extraction and filtering module 12, the digital values $D_{SR}$ regarding the reference analog signal $S_R(t)$.

The first extraction and filtering module 11 generates the first mean amplitude A1 and second extraction and filtering module 12 generates the second mean amplitude A2, as, for example, illustrated in FIG. 2.

It is observed that the angular frequency $\omega_q$ of q(t) is greater than the characteristic frequency of the type 1/f fluctuations of the gain of the first analog-digital converter 7, the first and second mean amplitudes A1 and A2 are affected by the same mean value of $G_{ADC}$ comprising the gain fluctuations of the first analog-digital converter 7, as represented, in a simplified way, in the following:

$$A1 = a1 G_{ADC}(t); \quad A2 = a2 G_{ADC}(t) \quad (1)$$

The calculating module 13 evaluates the ratio A1/A2:

$$V_{RT} = A1/A2 = a1 G_{ADC}/a2 G_{ADC} = a1/a2 \quad (2)$$

and therefore, eliminates the fluctuations represented by the mean gain $G_{ADC}(t)$, and enables to obtain the mean amplitude a1 representative of the amplitude of the signal $S_M(t)$ to be measured, since it is known the amplitude a2 of the reference signal, for example, when an electric quantity is measured, such as an impedance, the information of interest is just the ratio a1/a2.

It is observed that the electronic device 1 supplies a ratio value $V_{RT}$ referring to the mean amplitudes of the signals, evaluated in a predetermined time interval before generating the output value. The operation of calculating the mean amplitudes A1 and A2 and of calculating the ratio value $V_{RT}$, continuously repeated with time, generates a sequence of output values referable to the mean values of the signals during different time intervals.

FIG. 3 schematically shows a second embodiment of the electronic device 1, in which two analog-digital converters are used. Particularly, the electronic device has the analog-digital conversion module 2 and the first output switching module 10 differently implemented from what described with reference to FIG. 1.

More particularly, the analog-digital conversion module 2 of FIG. 3, comprises: a second input switching module (or diverter) 22, the respective first analog-digital converter 7 (ADC1) and a second analog-digital converter 23 (ADC2) provided with a second conversion terminal 24 and a second output terminal 25.

The second input switching module 22 is such to take a first configuration wherein the first input terminal 4 is connected to the first conversion terminal 8 and the second input terminal 5 is connected to the second conversion terminal 24. In this first configuration, the same time portion of the analog signal $S_M(t)$ to be measured is digitally converted by the first analog-digital converter 7 (ADC1), while the simultaneous time portion of the reference analog signal $S_R(t)$ is digitally converted by the second analog-digital converter 23 (ADC2).

Based on the pilot signal q(t), the second inlet switching module 22 has, as an alternative to the first configuration, also a second configuration wherein the first input terminal 4 is connected to the second conversion terminal 24, and the second input terminal 5 is connected to the first conversion terminal 8. In this second configuration, a same time portion of the analog signal $S_M(t)$ to be measured is digitally converted by the second analog-digital converter 23 (ADC2) while the simultaneous time portion of the reference analog signal $S_R(t)$ is digitally converted by the first analog-digital converter 7 (ADC1).

Referring to the first output switching module 10, in the case of FIG. 3, this is analogous to the second input switching module 22 and is interposed between the first 9 and second output terminals 25 and the first 14 and second processing terminals 15. The first output switching module 10 can take a first operative configuration wherein the first output terminal 9 is connected to the first processing terminal 14 and the second output terminal 25 is connected to the second processing terminal 15.

Moreover, the first output switching module 10 can take a second operative configuration wherein the first output terminal 9 is connected to the second processing terminal 15 and the second output terminal 25 is connected to the first processing terminal 14.

The first output switching module 10 is switched in order to supply to the first processing terminal 14, all the digitally converted time portions $D_{SM}$ of the signal $S_M(t)$ to be measured, and to supply, to the second processing terminal 15, all the digitally converted time portions $D_{SR}$ of the reference signal $S_R(t)$ according to the sequence wherein they were generated.

With reference to the operation of the device in FIG. 3, it is analogous to what described with reference to FIG. 1.

Particularly, it is observed that the first and second mean amplitudes A1 and A2, evaluated by the first and second extraction and filtering modules 11 and 12 in time intervals, particularly greater than or at least equal to the period $T_q$ of q(t), are both affected by the mean value of the gain fluctuations of the first and second analog-digital converters 7 and 23. Therefore, the value $V_{RT}$ of the ratio between the two mean amplitudes A1 and A2 is independent from these fluctuations, analogously as what expressed by the relationships (1) and (2).

Moreover, it is observed that the embodiment in FIG. 3, using two analog-digital converters 7 and 23 simultaneously operating, is particularly effective because it is possible to completely reconstruct the digital version of the signal $S_M(t)$ to be measured, at the first processing terminal 14, and the one of the reference signal $S_R(t)$, at the second processing terminal 15.

Figure 4:
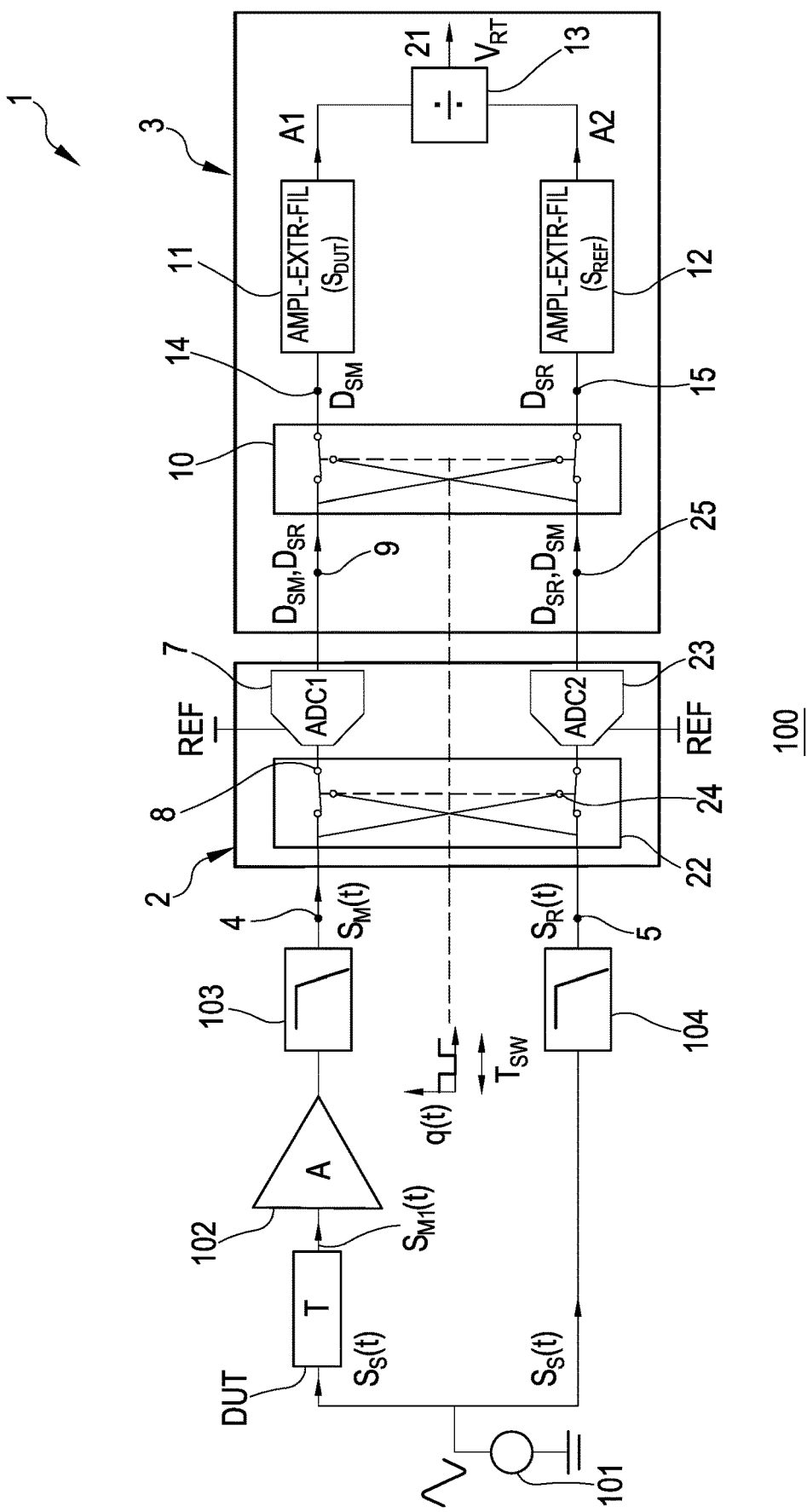
FIG. 4 schematically shows an example of a measure system comprising the measure electronic device in FIG. 3.

FIG. 4 refers to an example of application of the measuring device 1, particularly in the embodiment of FIG. 3, in a measuring system 100, according to an arrangement of the "lock-in amplifier" type.

Particularly, the measuring system 100 is configured for measuring the amplitude of the frequency answer of a linear system.

The measuring system 100 of FIG. 4 comprises a stimulus signal generator 101, a system to be measured DUT, an amplifier 102 (A), a first anti-aliasing filter 103, a second anti-aliasing filter 104, and the electronic measuring device 1, in the embodiment in FIG. 3.

A stimulus analog signal $S_S(t)$, for example a sinusoidal one, is taken from the stimulus signal generator 101. The system to be measured DUT, having a transfer function T, can be for example, a sensor, an electronic device or circuit. The stimulus analog signal $S_S(t)$ passes through the system to be measured DUT which gives back a first measuring signal $S_{M1}(t)$.

The amplifier 102 and first anti-aliasing filter 103 enable to suitably condition the first measuring signal $S_{M1}(t)$ (including the information about the transfer function T of the system DUT) in order to supply to the first inlet terminal 4 of the electronic device 1, the analog signal $S_M(t)$ to be measured.

The second anti-aliasing filter 104, operating on the other version of the stimulus signal $S_S(t)$ which embodies a reference, gives back the reference analog signal $S_R(t)$ to be supplied to the second input terminal 5 of the electronic device 1.

As already illustrated, these signals $S_M(t)$ and $S_R(t)$ will be digitally alternately converted by the first analog-digital converter 7 (ADC1) and by the second analog-digital converter 23 (ADC2) and are reconstructed in the digital field for extracting the corresponding mean amplitudes.

Referring to the digital values $D_{SM}$, reconstructed at the first processing terminal 14, they can be expressed by the following analog signal $S_{DUT}(t)$:

$$S_{DUT}(t)=A_S \sin(\omega_0 t+\varphi_{DUT})T_{DUT}\cdot[G_{ADC1}(t)q(t)+G_{ADC2}(t)(1-q(t))] \quad (3)$$

wherein:

$A_S$ is the amplitude of the signal supplied by the stimulus generator 101;

$\omega_0$ is the pulsation of the signal supplied by the stimulus generator 101;

$\varphi_{DUT}$ is the phase associated to the transfer function T of the system to be measured DUT having the pulsation $\omega_0$;

$T_{DUT}$ is the amplitude associated to the transfer function T of the system to be measured DUT having the pulsation $\omega_0$;

q(t) is the trend of the pilot signal, as already defined; for example, a square period wave:

$$T_q = \frac{1}{2\pi\omega_q}$$

$G_{ADC1}(t)$ represents the gain, with the respective fluctuations, associated to the first analog-digital converter 7 (ADC1);

$G_{ADC2}(t)$ represents the gain, with the respective fluctuations, associated to the second analog-digital converter 23 (ADC2).

Referring to the digital signal $D_{SR}$, reconstructed in the second processing terminal 15, it can be expressed by the following analog signal $S_{REF}(t)$:

$$S_{REF}(t)=A_S \sin(\omega_0 t)\cdot[G_{ADC2}(t)q(t)+G_{ADC1}(t)(1-q(t))] \quad (4)$$

wherein already defined magnitudes are present.

Expressing the equation (3) in the frequency field will give in the range of the pulsation $\omega_0$:

$$F\{S_{DUT}(t)\}=A_S T_{DUT}\cdot(\tfrac{1}{2}G_{ADC1}(\omega-\omega_0)+\tfrac{1}{2}G_{ADC2}(\omega-\omega_0)) \quad (5)$$

Expressing the equation (4) in the frequency dominium will give in the range of the pulsation $\omega_0$:

$$F\{S_{REF}(t)\}=A_S\cdot(\tfrac{1}{2}G_{ADC1}(\omega-\omega_0)+\tfrac{1}{2}G_{ADC2}(\omega-\omega_0)) \quad (6)$$

From the expressions (5) and (6), it is observed that both the signal to be measured and the reference signal have a gain proportional to the gain fluctuations of both the used analog-digital converters.

Figure 8:
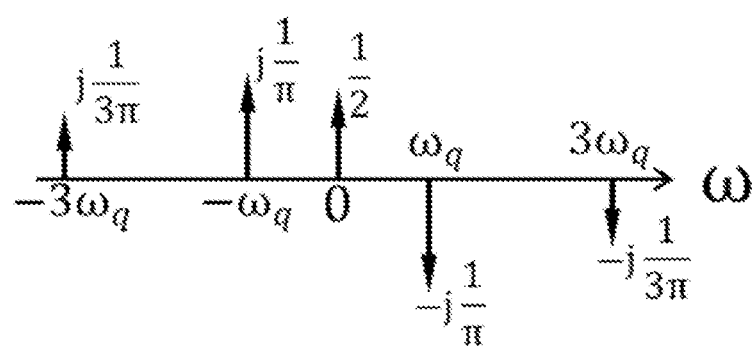
FIG. 8 is an illustration of an expression of a square wave pilot signal q(t) in the frequency field.

It is observed that the square wave pilot signal q(t) can be expressed, in the frequency field, as indicated in the diagram illustrated in FIG. 8.

The relationships in the equations (5) and (6) are consequently valid for $|\omega-\omega_0|$ sufficiently smaller than $\omega_q$ in order to avoid the effects of the harmonics generated from q(t) to $\omega_0 \pm \omega_q$, $\omega_0 \pm 3\omega_q$, etc.

After the operations performed by the first extraction and filtering module 11 and second extraction and filtering module 12, the mean amplitudes A1 and A2 of the digital signals obtained can be represented by the following expressions:

$$A1 = A_S\ T_{DUT} \cdot \left[\frac{1}{2}\overline{G_{ADC1}(t)} + \frac{1}{2}\overline{G_{ADC1}(t)}\right] \quad (7)$$

$$A2 = A_S \cdot \left[\frac{1}{2}\overline{G_{ADC1}(t)} + \frac{1}{2}\overline{G_{ADC2}(t)}\right] \quad (8)$$

Therefore, the ratio $V_{RT}$ calculated by the calculating module 13, will give back the mean amplitude $T_{DUT}$ representative of the amplitude associated to the transfer function T of the system to be measured DUT $$\frac{A_1}{A_2} = T_{DUT} \quad (8)$$

From the spectral analysis of the signals, it is observed that particularly satisfying results are obtained by driving the second inlet switching module 22 and first output switching module 10 at a frequency greater than the corner frequency $\omega_C$ of the noise 1/f of the demodulated signal (which can be easily obtained) in order to exactly take the mean trend of the fluctuations of the two analog-digital converters 7 and 23 to the base band. On the contrary, the contributions of the higher harmonics (particularly the first one) would be intermixed in the base band signal deteriorating the same. By the hereinabove calculation, the answer of the system to be measured DUT is considered not much variable in the range of the working frequency ($\omega_0 \pm \omega_C$).

Experimental Results

Figure 5:
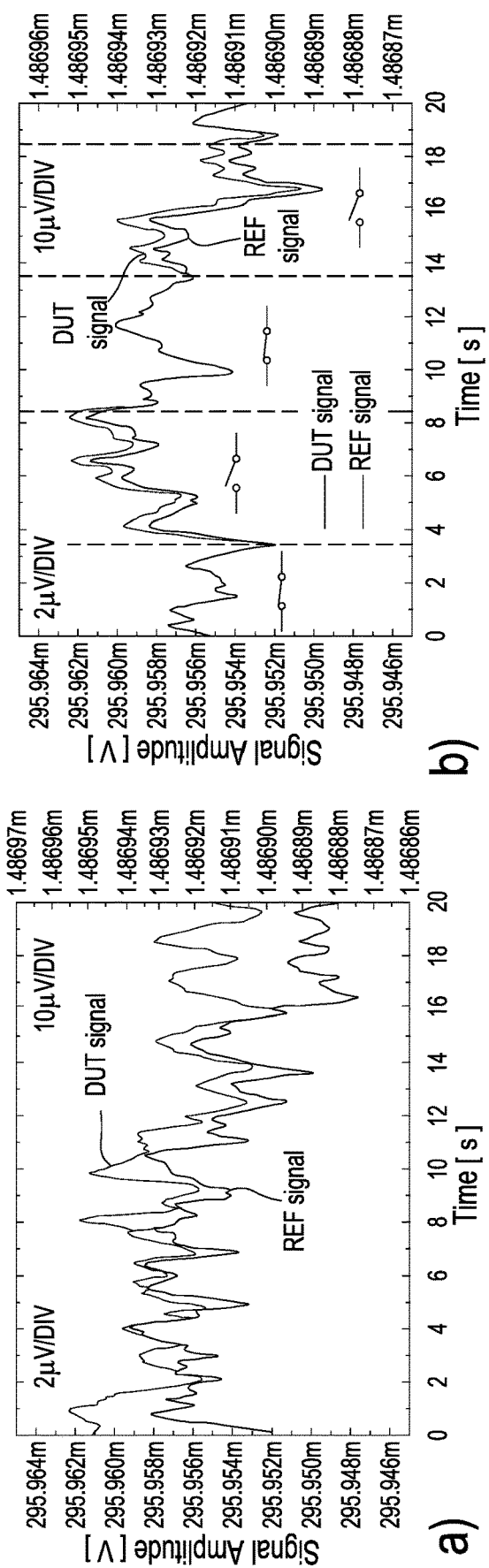
FIG. 5 refers to a first experiment.

The Applicant has done an experiment in which measured a variable resistance (a variation of about 6 ppm) as a system to be measured DUT. FIG. 5c schematically shows the experimental used set-up, wherein the electronic device 1 is analogous to the one in FIG. 3.

It is used a first resistor $R_1$ having a resistance equal to 1 kΩ), for injecting a current in a second resistor Rs having a resistance equal to 250Ω which, by a switching module 26, changed the value of the resistance of 1.4 kΩ with a frequency equal to 0.1 Hz.

The measurement was performed with $\omega_0=2\pi f_0$ equal to 1 kHz in order to avoid phenomena caused by stray capacities of the switching module 26 and the frequency of the switching modules 22 and 10 $\omega_q=2\pi f_q$ being equal to 200 Hz.

The diagrams in FIGS. 5a and 5b show the measurement signal "DUT signal" and the reference signal "REF signal". With reference to FIG. 5a, the second input switching module 22 and first output switching module 10 are turned off, while with reference to FIG. 5b they are turned on.

When the switching modules 22 and 10 are turned on, the signals DUT and REF fluctuate in a correlated way and proportionally to the amplitude of the signal itself (it is observed that the two signals have amplitudes which are substantially different) and it is possible to visually locate the variations of the resistance, such variations can be easily measured by performing the ratio between the signals.

FIG. 5d compares the high resolution measurement with a single channel standard measurement (which provide to acquire only the measurement signal DUT) and wherein it is not possible to distinguish the resistance variations.

If the switching modules 22 and 10 are not active (FIG. 5a), it is observed that the two signals are not well correlated and consequently the ratio between the two does not give the advantages obtainable in the case of FIG. 5b.

Figure 6:
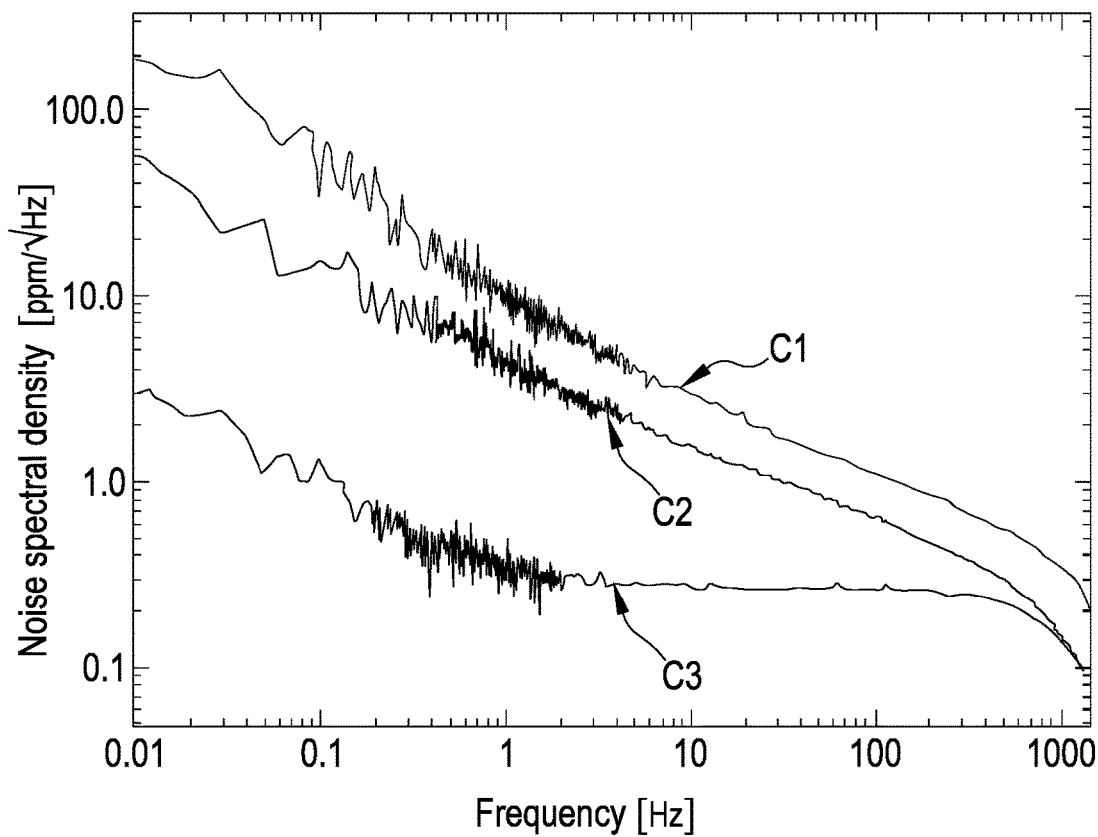
FIG. 6 shows experimental curves.

FIG. 6 specifically shows the performances, in terms of resolution under the above described measurement conditions. Particularly, FIG. 6 shows the FFT of the demodulated signal, obtained by connecting the stimulus signal directly to the acquisition channel in case: of the commercially available Zurich Instruments HF2LI device (curve C1), of the device in FIG. 3 but in a case, it is read the single channel (curve C2) and lastly of the device in FIG. 3, by using the two analog-digital converters 7 and 23 (curve C3).

At a low frequency, it is observed that the improvement obtained by the curve C3 is factor 10 greater than the case of curve C2 and is factor almost 100 greater than the commercially available instrument (curve C1).

It is noteworthy to observe that the performances of the measurement device 1 does not depend on matching the amplitude and phase of the measurement signal and reference signal to each other.

Figure 7:
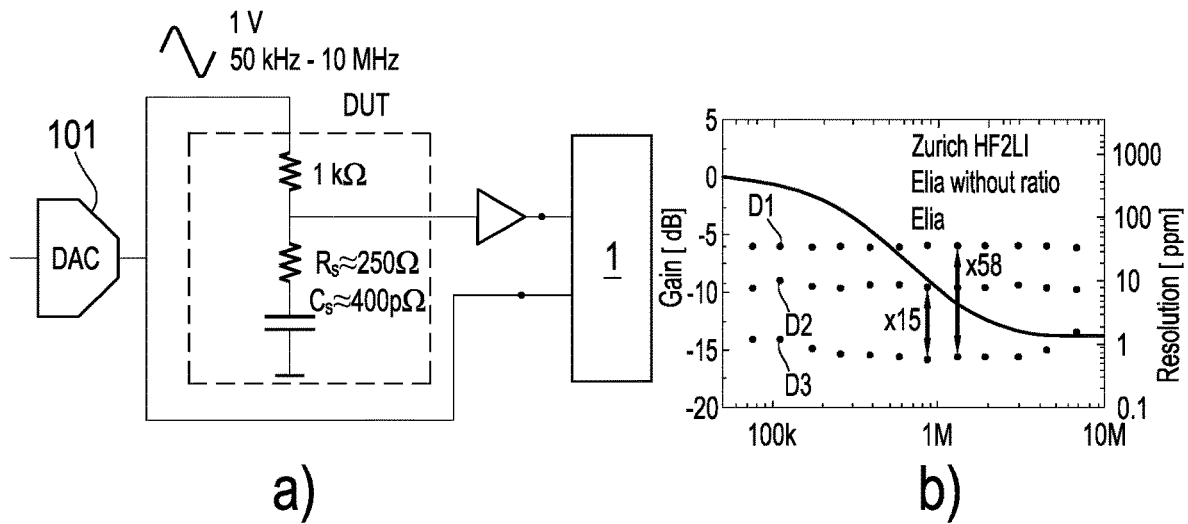
FIG. 7 refers to a second experiment.

FIG. 7b, which refers to another experiment (using the arrangement in FIG. 3), shows the transfer function of a system to be measured DUT which has a pole and one zero (FIG. 7a). During the frequency scan from 50 kHz to 1 MHz no parameter of the device is modified, expect for the lock-in frequency.

Moreover, FIG. 7b shows the values of the resolution in case is used: the commercially available Zurich Instruments HF2LI device (curve D1), the measurement device 1 of FIG. 3 with a single channel (curve D2), and in case of a complete use of the device in FIG. 3 (curve D3).

It is obtained (curve D3) an improvement of the resolution for all the frequencies by reaching values smaller than 1 ppm between 100 kHz and 5 MHz. At 10 MHz, by approaching the frequency of the anti-aliasing filter (20 MHz), the performances start to deteriorate (3.8 ppm) obtaining at the same time an improvement of a factor 2 with respect to a single channel measurement (curve D2). The absolute value of signal of interest, as the frequency varies, varies of a factor 5 and is subjected to a substantial phase shift, despite this fact the technique continues to operate without requiring changes of the parameters, in contrast to what would happen with a differential type measurement which requires an accurate adjustment of the reference signal for each measurement frequency.

The described experiments show that the electronic device 1 is a solution enabling to improve the maximum resolution obtainable from a lock-in amplifier.

The teachings of the invention can find an application in all the electronic systems wherein it is required to perform high resolution measurements of slowly varying electrical signals or of the amplitude of periodical or modulated electric signals. Particularly, the described technique is adapted to improve the maximum resolution obtainable from a digital lock-in amplifier, an instrument which has a wide application in all the research and industrial fields wherein high resolution measurements of a periodical signal are required.

Further, improving the maximum resolution obtainable from an acquisition system, the described technique can be used both for obtaining very high resolutions (measuring variations less than a part per million) and for improving the performances of the acquisition systems which, due to economic or technological causes (for example dictated by a high working frequency), exhibit a substantial random fluctuation of the gain.

The invention claimed is:

1. Electric quantities measure electronic device, comprising:
   an analog-digital conversion module configured to receive an analog signal (SM(t)) to be measured and a reference analog signal (SR(t)), the analog-digital conversion module being configured to digitally convert, alternatively and according to a switching frequency, time portions of the analog signal (SM(t)) to be measured alternated with time portions of the reference analog signal (SR(t)), for supplying respective first (DSM) and second pluralities (DSR) of digital values, the switching frequency being greater than a frequency associated to undesired fluctuations of the gain of the analog-digital conversion module; and
   a digital processing module configured to:
      calculate a first mean amplitude (A1) of the first plurality of digital values and a second mean amplitude (A2) of the second plurality of digital values; the first and second mean amplitudes being proportional to a mean gain value of the analog-digital conversion module; and
      supply a ratio value (VRT) of the first mean amplitude to the second mean amplitude, representative of a measured amplitude of the analog signal (SM(t)) to be measured.

2. Electronic device according to claim 1, wherein the analog-digital conversion module comprises:
   a first and second input terminals configured to respectively receive the analog signal (SM(t)) to be measured and the reference analog signal (SR(t));
   a first switching module configured to selectively connect/disconnect the first and second input terminals to/from a first conversion terminal;
   at least one first analog-digital converter connected to said first conversion terminal to receive said time portions of the analog signal (SM(t)) to be measured and said time portions of the reference analog signal (SR(t)), and provided with a first output terminal for alternatively supplying the first and second pluralities of digital values (DSM, DSR).

3. Electronic device according to claim 2, wherein the processing module comprises:
a second switching module configured to selectively connect/disconnect the first output terminal to/from a first and second processing terminals in order to supply the first pluralities of digital values (DSM) at the first processing terminal and the second pluralities of digital values (DSR) at the second processing terminal.

4. Electronic device according to claim 3, wherein the processing module comprises:
a first extraction and filtering module configured to extract from the first pluralities of digital values (DSM) the first mean amplitude (A1);
a second extracting and filtering module configured to extract from the second pluralities of digital values ($D_{SR}$) the second mean amplitude (A2);
a calculating module for calculating said ratio value (VRT).

5. Electronic device according to claim 4, wherein the first extracting and filtering module comprises:
a first digital multiplier configured to multiply the first pluralities of digital values (DSM) by a first multiplication signal (cos) and return an in-phase signal;
a second digital multiplier configured to multiply the first pluralities of digital values (DSM) by a second multiplication signal (sin) in quadrature with said first multiplication signal; the second multiplier is configured to return a quadrature signal;
a first and second mean filters configured to filter the in-phase signal and the quadrature signal and return a first and second filtered signals;
a module for calculating the amplitude from said first and second filtered signals, configured to supply said first mean amplitude (A1).

6. Electronic device according to claim 3, wherein the second switching module is further configured to connect/disconnect the second output terminal to/from the first and second processing terminals in order to supply the further first pluralities of digital values (DSM) to the first processing terminal and the further second pluralities of digital values ($D_{SR}$) to the second processing terminal.

7. Electronic device according to claim 6, wherein the second switching module is synchronized to the first switching module.

8. Electronic device according to claim 2, wherein:
the first switching module is further configured to selectively connect/disconnect the first and second input terminals to/from a second conversion terminal;
and wherein the analog-digital conversion module further comprises:
a second analog-digital converter connected to said second conversion terminal and provided with a second output terminal; the second analog-digital converter being configured to digitally convert further time portions of the analog signal (SM(t)) to be measured, and further time portions of the reference analog signal (SR(t)) and to supply to the second output terminal further first pluralities of digital values (DSM) alternate with further second pluralities of digital values ($D_{SR}$).

9. Electronic device according to claim 1, wherein the first switching module is driven from a periodic driven signal (q(t)) having a period (Tq) and an angular frequency ($\omega q$), the angular frequency ($\omega q$) being greater than a frequency associated to undesired fluctuations of the gain of the first analog-digital conversion module.

10. Measuring electronic system comprising:
a module to be measured configured to receive a stimulus signal (Ss(t)) and supply an analog signal (SM(t)) to be measured,
an input module configured to receive a first reference signal (Ss(t)) and to supply a reference analog signal (SR(t));
a measuring electronic device comprising:
an analog-digital conversion module configured to receive an analog signal (SM(t)) to be measured and a reference analog signal (SR(t)), the analog-digital conversion module (2) being configured to digitally convert, alternatively and according to a switching frequency, time portions of the analog signal (SM(t)) to be measured alternated with time portions of the reference analog signal (SR(t)), for supplying respective first (DSM) and second pluralities ($D_{SR}$) of digital values the switching frequency being greater than a frequency associated to undesired fluctuations of the gain of the analog-digital conversion module; and
a digital processing module configured to:
calculate a first mean amplitude (A1) of the first plurality of digital values and a second mean amplitude (A2) of the second plurality of digital values; the first and second mean amplitudes being proportional to a mean gain value of the analog-digital conversion module;
supply a ratio value (VRT) of the first mean amplitude to the second mean amplitude, representative of a measured amplitude of the analog signal (SM(t)) to be measured,
wherein said ratio value (VRT) is representative of an measured amplitude of a transfer function of said module to be measured.

11. Measuring system according to claim 10, wherein:
the module to be measured comprises: an electronic device (DUT) of which the amplitude of the transfer function is measured, an amplifier and a first anti-aliasing filter;
the input module comprises a second anti-aliasing filter.

12. Measuring system according to claim 10, wherein the first extracting and filtering module comprises:
a first digital multiplier configured to multiply the first pluralities of digital values (DSM) by a first multiplication signal (cos) and return an in-phase signal;
a second digital multiplier configured to multiply the first pluralities of digital values (DSM) by a second multiplication signal (sin) in quadrature with said first multiplication signal; the second multiplier is configured to return a quadrature signal;
a first and second mean filters configured to filter the in-phase signal and the quadrature signal and return a first and second filtered signals;
a module for calculating the amplitude from said first and second filtered signals, configured to supply said first mean amplitude (A1).

* * * * *